United States Patent [19]

Chobot et al.

[11] Patent Number: 5,363,280
[45] Date of Patent: Nov. 8, 1994

[54] PRINTED CIRCUIT BOARD OR CARD THERMAL MASS DESIGN

[75] Inventors: Ivan I. Chobot, Whitby, Canada; John A. Covert, Binghamton; Randy L. Haight, Waverly, both of N.Y.; Keith D. Mansfield, New Milford, Pa.; Donald W. Miller, Newark Valley, N.Y.; Reinaldo A. Neira; Alexander Petrovich, both of Endicott, N.Y.; Paul C. Sviedrys, Great Neck, N.Y.; Louise A. Tiemann, Endwell, N.Y.; Gerald A. Valenta, Haw River, N.C.; Thurston B. Youngs, Jr., Vestal, N.Y.

[73] Assignee: International Business Machines Corporation, Armonk, N.Y.

[21] Appl. No.: 50,589

[22] Filed: Apr. 22, 1993

[51] Int. Cl.⁵ .............................................. H05K 7/20
[52] U.S. Cl. .................................... 361/794; 174/266; 361/693; 361/778

[58] Field of Search ............... 257/709, 713; 174/15.1, 174/252, 260, 266; 361/689, 690, 692, 693, 704, 764, 773, 777, 778, 792, 794, 799, 772

[56] References Cited

U.S. PATENT DOCUMENTS

| | | |
|---|---|---|
| 4,628,409 | 12/1986 | Thompson et al. |
| 4,729,061 | 3/1988 | Brown ................... 361/386 |
| 4,792,646 | 12/1988 | Enomoto ............. 174/68.5 |
| 4,845,308 | 7/1989 | Womack, Jr. ........ 174/15.4 |
| 4,982,311 | 1/1991 | Dehaine ............... 361/388 |

Primary Examiner—Gerald P. Tolin
Attorney, Agent, or Firm—Pollock, Vande Sande & Priddy

[57] ABSTRACT

A multi-layer printed circuit board or card including at least one passage in at least one of the layers of the circuit board or card for preventing the diffusion of heat throughout the circuit board or card during the securing or removal of components in plated through holes in the circuit board or card by the heating of the plating material to a temperature above a melting point of the plating material.

19 Claims, 7 Drawing Sheets

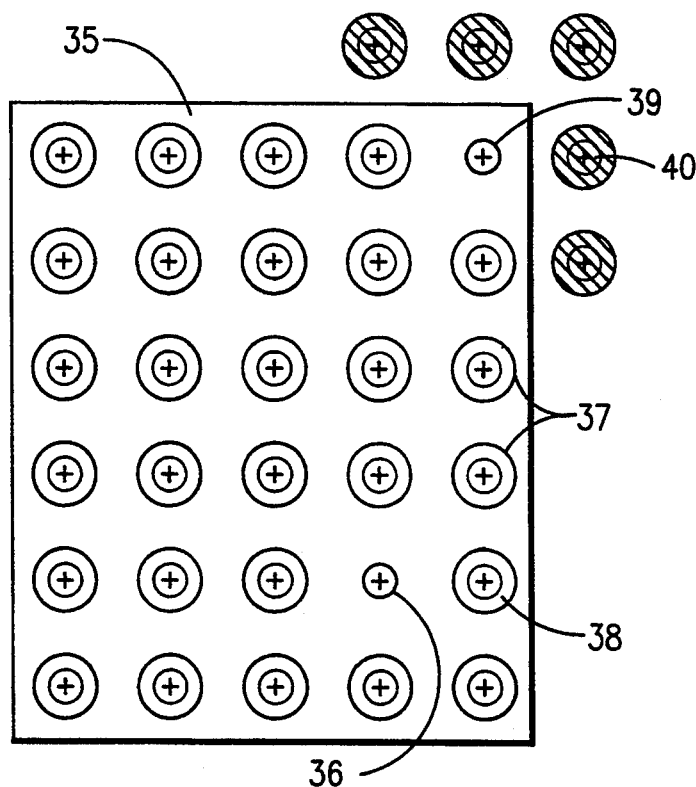
FIG. 11
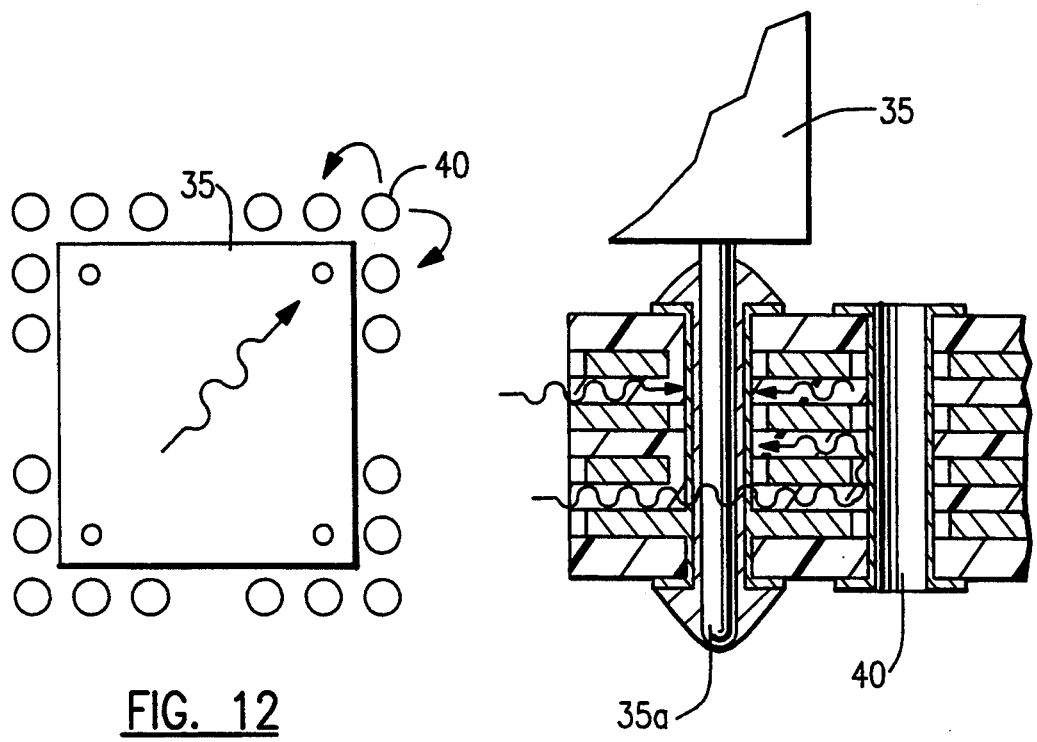
FIG. 12
FIG. 13

PRINTED CIRCUIT BOARD OR CARD THERMAL MASS DESIGN

FIELD OF THE INVENTION

The invention relates generally to printed circuit boards and cards, and more particularly to an improved printed circuit board design enhancing heat flow through the circuit board to heat traps or thermal vents thereby preventing heat build up in the circuit board or card.

BACKGROUND OF THE INVENTION

During rework of a circuit board, the process of removing components from the board, two conflicting goals must be accomplished. First, the proper heat must be maintained to allow the solder securing the components to the circuit board to reach and remain at the reflow temperature. Secondly, it is necessary to prevent the applied heat from dispersing through the circuit board to adjacent components and causing potentially damaging stress to the circuit board or card and components attached thereto.

It is common to mount complex electronic components on printed boards by inserting pins extending from components into plated through holes in the circuit board and soldering them in place. The plated through holes normally provide connections between the pins and conductive material situated at various levels of the circuit board or card.

As the number of components attached to the circuit board increases, both the number of pins and the number of times the board must be heated to solder the pins in place increase. Therefore, during rework, a great amount of heat is potentially applied to a circuit board or card.

As the circuit board increases in size and thickness, the total amount of copper and the number of planes common to a single via all contribute to insufficient soldering and the inability to rework an assembly. Further, the soldering process is adversely effected when tied planes in a circuit board or card, that is, planes in the circuit board or card that are electrically connected to the through hole, allow heat being applied to the plated through hole to escape into the internal planes of the circuit board. The escape of heat from the through hole reduces the through hole temperature to below the solder melting point resulting in insufficient hole fill.

The draining of heat from the through hole is especially prevalent when two or more planes are common to a single through hole. This allows heat to escape into the internal planes of the circuit board or card from the plated through hole, thereby inhibiting the top surface of the carrier from reaching the solder reflow temperature. Thicker circuit boards that do not have common power planes also experience rework problems. It is also essential that when heat is applied to the circuit board during rework that the temperature not exceed the melting point of the material used to form the circuit board. However, enough heat must be applied to the solder to cause the solder to melt throughout the length of the plated through hole.

SUMMARY OF THE INVENTION

An objective of the present invention is to provide a new circuit board design to prevent the above described problems. One modification to circuit board design which may prevent overheating and damage to a high performance card assembly during assembly and rework includes providing thermal venting means to the card structure. Alternatively, a low inductance thermal relief design in the power plane may be used in conjunction with an optimum connection scheme traversing through all the layers of the card. A third option for an improved thermal design for manufacturing high performance circuit board and card assemblies is to create a thermal network using power vias.

The present invention solves problems existing in the manufacturing of high density, high performance card assemblies through the use of modifications to power plane connections by providing a multi-layer printed circuit board or card including a plurality of power, ground, and insulating planes having a plurality of holes formed therethrough. The through holes have an electrically conductive material plated onto the inside surface. At least one integrated chip or component is attached to the circuit board or card such that pins at least partially made of an electrically conductive material and attached to a surface of the chip or component extend into the plated through holes. The circuit board or card comprises at least one passage in at least one of the planes for preventing the diffusion of heat throughout the circuit board or card during the securing or removal of the pins in the plated through holes. The pins are secured by the heating of the plating material to a temperature above its melting point.

BRIEF DESCRIPTION OF THE DRAWINGS

FIG. 11 represents a partial overhead view of a printed circuit board including heat trap vias placed about the periphery of a component attached to a circuit board or card according to one embodiment of the present invention.

FIG. 12 represents an overhead view of a module attached to a circuit board or card including heat trap vias showing the flow of heat through the circuit board or card according to the embodiment in FIG. 11.

FIG. 13 represents a close-up cross-sectional view of the circuit board according to the embodiment of the present invention shown in FIGS. 11 and 12.

DETAILED DESCRIPTION OF VARIOUS AND PREFERRED EMBODIMENTS

Multi-layer circuit boards and cards are formed from multiple layers, some of which are made of electrically conductive material and some of electrically insulating material. A number of holes are formed in circuit boards and cards for the connecting of integrated circuits and various other components. The components may have pins extending from their surface which are inserted into the holes in the circuit board or card. The holes are coated, or plated, with electrically conductive material which is functionally connected to the component. Such holes are often referred to as plated through holes. The plating material on the inside of the holes is selectively connected to the layers of the circuit board or card.

Components are usually secured to a circuit board or card by causing the plating material in the plated through holes to be heated to a temperature at which it will flow and form a functional and secure connection with the component. However, during this process, known as rework, the heat in the plating material can dissipate through the circuit board or card, damaging the rest of the card and other attached components. An additional problem associated with reworking processes is that when the heat dissipates away from the plated through hole, it is not available to melt the plating material on the through hole.

The present invention provides a solution to the thermal management problems known to exist in circuit board and card rework processes. Accordingly, the present invention provides means to direct the heat generated by the rework process away from the components and to prevent the dissipation of heat throughout the rest of the circuit board or card.

Figure 1:
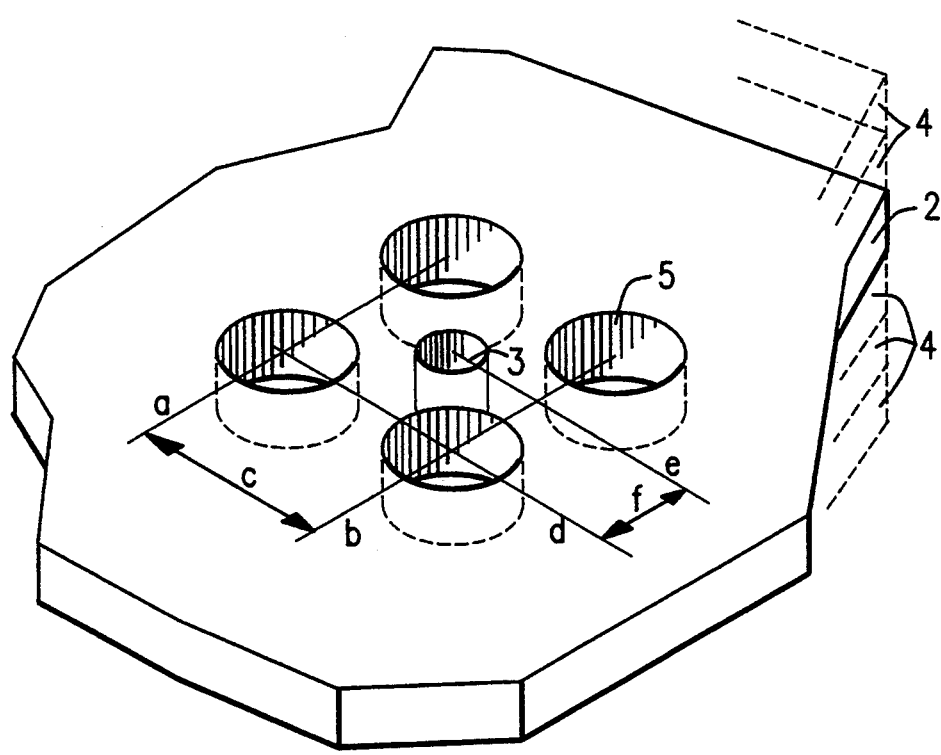
FIG. 1 represents a perspective view of a printed circuit board or card including thermal vents according to one embodiment of the present invention thermal mass design.

FIG. 1 depicts a section of a multi-layer circuit board or card 1 including one of the conductive planes 2 and a plated through hole 3. A multi-layer board such as the one depicted in FIG. 1 commonly contains a number of such holes. The power plane 2 is just one of a number of planes making up the board. The power plane 2 consists of a substantially uniform layer of some type of conductive material. Some holes in a circuit board are not plated and some do not extend through the entire circuit board or card. Pins may be inserted in any type of hole.

The embodiment shown in FIG. 1 includes four thermal vents 5 located near the plated through hole 3 in the power plane 2. The vents 5 are simply open areas in the power plane in which no conductive material has been laid down or from which the conductive material was etched away chemically or physically removed. Preferably, a plurality of these vents are located throughout the power plane, surrounding every plated through hole which will be subjected to the rework process. When a pin is inserted into the plated through hole 3 and soldered in place, the vents act as insulators, blocking the diffusion of heat through the card. The heat is trapped in the area adjacent to the plated through hole and ensures that the plating material will reach the reflow temperature. Such an arrangement of thermal vents, as seen in FIG. 1, does not degrade the performance of the power layer or layers in terms of resistance and conductance.

In the embodiment of the present invention shown in FIG. 1, the plated through holes have a diameter of approximately 0.031 inch and 0.040 inch. The center of the thermal vents is approximately 0.050 inch offset from perpendicular lines passing through the center of the plated through hole as indicated by "d", "e", and "f". The centers of the thermal vents are approximately 0.100 inch apart as indicated by "a", "b", and "c". The thermal vents themselves are approximately 0.075 inch in diameter.

Figure 2:
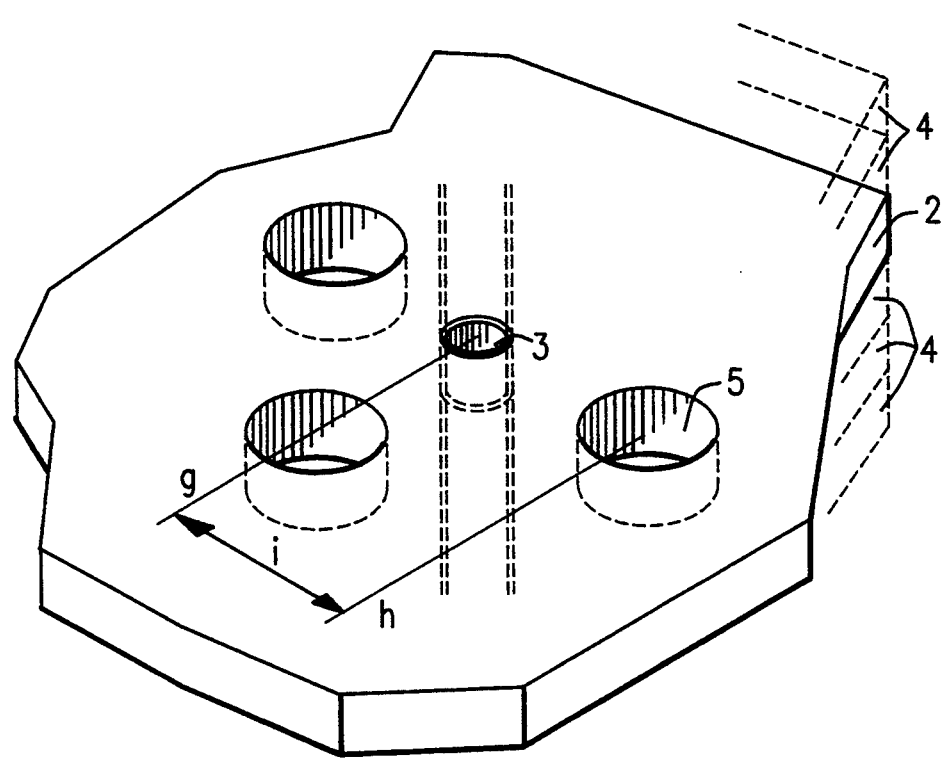
FIG. 2 represents a perspective view of a printed circuit board or card including thermal vents according to another embodiment of the present invention thermal mass design.
Figure 3A:
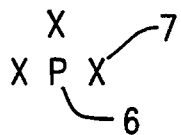
FIGS. 3a–g represent possible schemes for the placement of thermal vents in a printed circuit board or card according to the present invention.
Figure 3B:
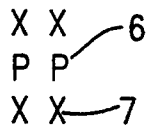
Figure 3C:
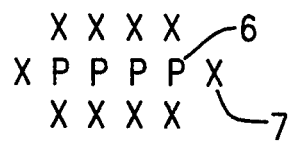
Figure 3D:
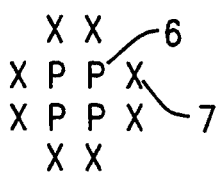
Figure 3E:
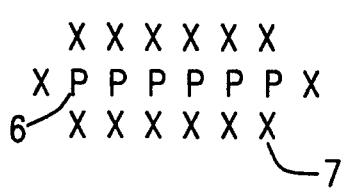
Figure 3F:
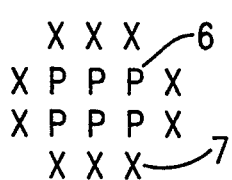
Figure 3G:
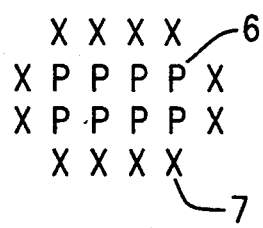
Figure 4A:
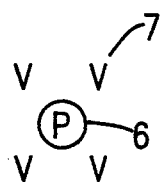
FIGS. 4a–e represent additional possible schemes for the placement of thermal vents in a printed circuit board or card according to the present invention.
Figure 4B:
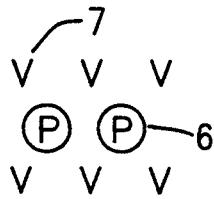
Figure 4C:
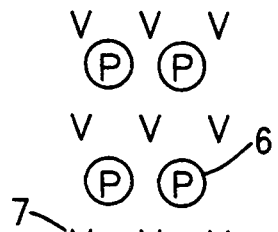
Figure 4D:
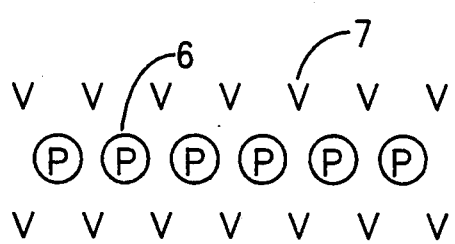
Figure 4E:
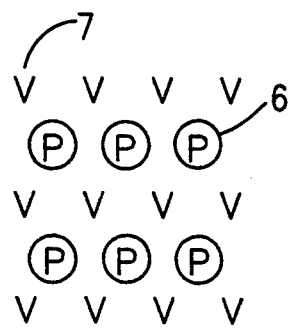

FIG. 2 represents an alternative embodiment for the placement of the thermal vents in the power plane of a multi-layer circuit board or card according to the present invention. The thermal vents in this embodiment are about 0.075 inch wide with centers about 0,100 inch apart as indicated by "g", "h", and "i" The thermal vents and the plated through hole in the embodiment shown in FIG. 2 are as thick as the power plane.

The dimensions of the vents must be adequate to result in the desired management of heat. Additionally, the vents must be of adequate size to deal with the particular reflow temperature of the plating material used on the circuit board or card. Also figuring into the determination of the number and size of the vents is the amount of plating material used on the plated through holes and the thickness of the particular card involved. Accordingly, the dimensions of the thermal vents are not limited to the examples provided herein.

If the circuit board or card is particularly thick, it might be desirable to include more and larger vents since more heat will have to be applied to the circuit board or card to cause the reflow of plating material in the center of the circuit board. Preferably, the thermal vents are not connected or attached to the power pins through a spoke. Such a spoke connection can channel the transmission of heat and may also cause inductance. Ssurrounding the pins the thermal vents will reduce the heat sinking capability of the power plane copper surrounding the plated through hole connection. Regardless of which arrangement for the vents is used, the arrangement of vents must also take into consideration maintaining the desired electrical characteristics of the power plane, attached chip or other component, and the overall circuit board or card.

FIGS. 3 and 4 represent possible arrangements for vents about particular numbers of power pins to insure the proper management of heat away from the power plane. As can be seen in FIGS. 3 and 4, the vents, designated "X" in FIG. 3 and "V" in FIG. 4, generally completely surround the area in the power plane where the through holes, designated by "p", in both figures, for the inserted pin, are formed. The number of vents provided depends upon the number of power pins projecting from an attached component. As seen in FIG. 4, the vents may be placed "off-grid" in relation to the grid arrangement of the through holes. In this off-grid arrangement, the through holes are arranged in one grid and the thermal vents in a similarly spaced grid formed in the circuit board or card such that each row of thermal vents is between two rows of through holes. Similarly, each row of through holes is between two rows of thermal vents.

Alternatively, the vents and pins may be on the same grid, as shown in FIG. 3. In the examples of through hole and thermal vent arrangement shown in FIG. 3, the through holes are arranged in groups and each group is surrounded by thermal vents. The number of thermal vents included about each group of pins may vary, depending upon the thermal requirements of the process involved. Each group of through holes may be associated with one or more attached chips, components, or modules.

Preferably, thermal vents should be used on all "non-tied" cross sections above approximately 0.062 inch thickness. Similarly, non-tied cross sections with thicknesses between approximately 0.040 inch and approximately 0.062 inch and having approximately two ounce power/ground planes should also incorporate thermal vents at isolated component pins.

Figure 5:
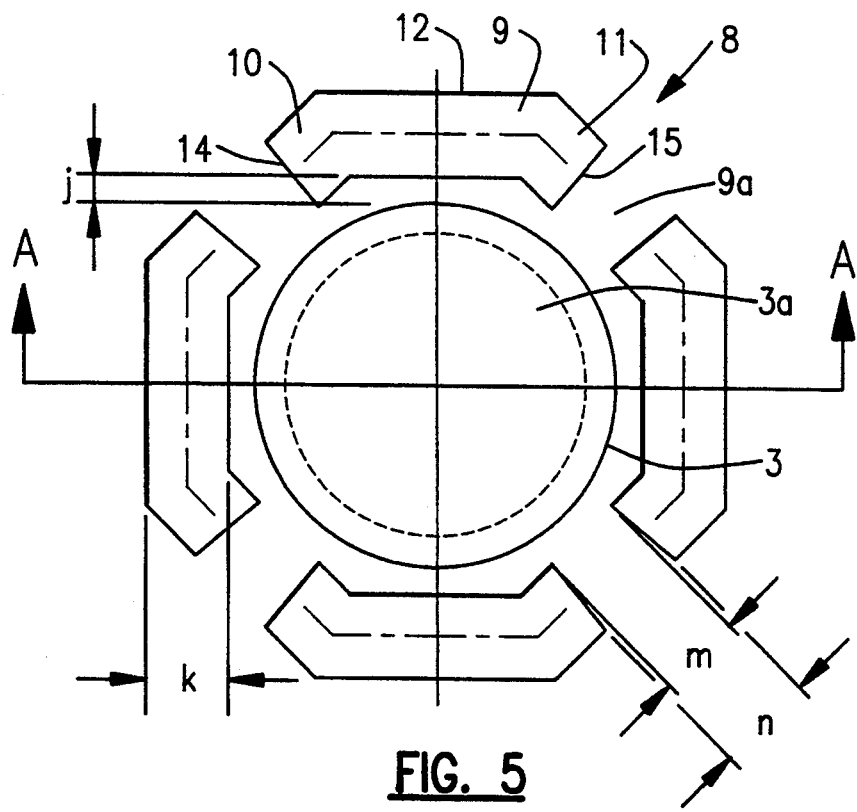
FIG. 5 represents an overhead cross-sectional view of a design for thermal vents according to one embodiment of the present invention.

In an alternative embodiment of the present invention, the thermal vents are laid out about the plated through hole 3 so as to form a series of symmetrically arranged spokes 8 as seen in FIG. 5. This vent arrangement shown in FIG. 5 is preferable where multiple ties to approximately one ounce copper or greater power planes are required. Each vent in the embodiment shown in FIG. 5 preferably has a main portion 9 and an adjacent side portion 10 and 11 on either side thereof. The main portion has edges 12 and 13 which are generally perpendicular to a diameter of the plated through hole the side portions and 11 are angled to follow the curvature of the pin as compared to the main portion 12. The ends 14 and 15 of the side portions 10 and 11 are angled, or have a tapered shape, so that the spokes 9a preferably become wider as the distance from the center of the plated through hole increases.

In the embodiment shown in FIG. 5, the vents are separated from the plated through hole by at least about 0.1 mil as indicated by "j" and are typically 0.25 mil wide as indicated by "k". Such an embodiment typically includes through holes 0.79 mil wide. In such an embodiment, the spokes are 0.2 mil thick at the point closest to the through hole as indicated by "m" and 0.29 mil at the point farthest from the through hole as indicated by "n". The above described embodiment is only one example of the dimension ranges for the vents according to the embodiment of the present invention shown in FIG. 5. Preferably, the vent size is about equal to the internal clearance maximum diameter of the given technology and must be sufficient to provide the desired thermal characterisitcs.

Figure 6:
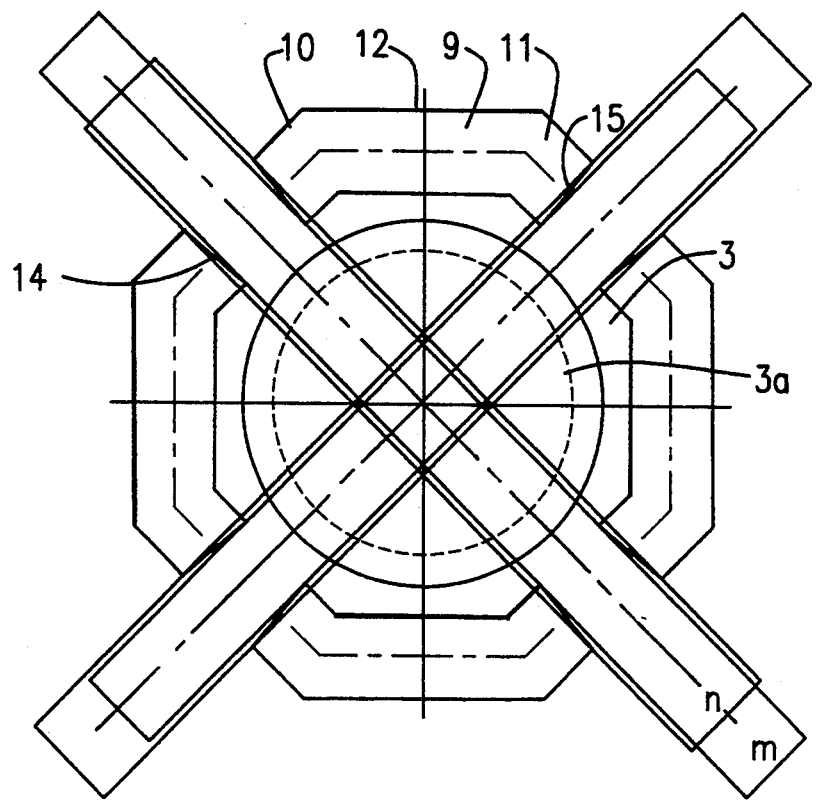
FIG. 6 represents a cross-sectional view along line A—A of the embodiment of the present invention shown in FIG. 5.
Figure 7:
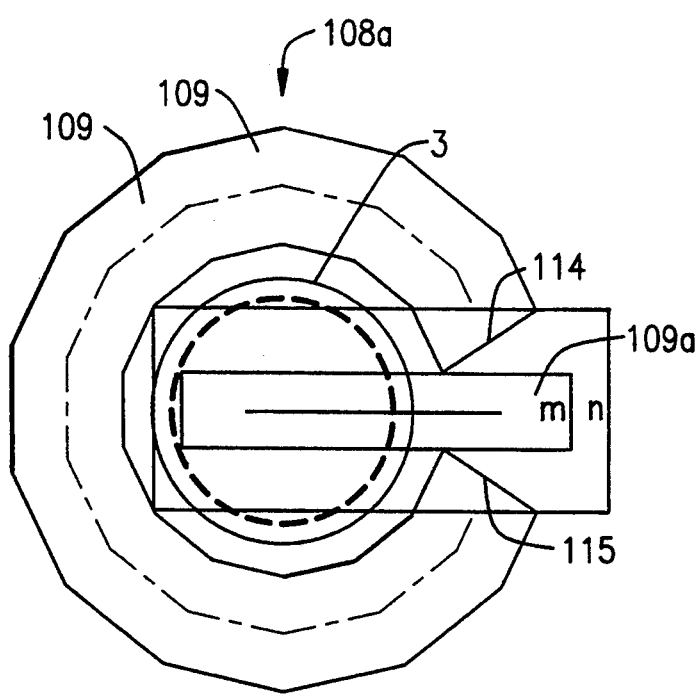
FIG. 7 represents an overhead cross-sectional view of the thermal vent design shown in FIG. 5.

FIGS. 6 and 7 show alternative embodiments of the spoke design for the thermal vents. The embodiment shown in FIG. 7 includes only a single spoke 109, with an inner width of approximately 0.008 inch and an outer width of approximately 0.014 inch. Preferably, the outer distance around the spoke is about equal to the maximum clearance opening. The vent 108 extends substantially around the pin and the plated through hole with a single "flared" entry to guarantee dimensional stability during manufacturing and to provide the added advantage of removing the long narrow channel electrical hit, thus reducing the added inductance or "noise" or reduction of capacitance. The vent 108 is preferably comprised of a plurality of similarly shaped segments 109. The ends 114 and 115 of the vent are angled, as in the embodiment shown in FIGS. 5 and 6. However, the actual shape of the vent may vary. For instance, the vent may be a smooth rounded shape.

Preferably, each spoke as seen in FIG. 5 is about 0.0098 inch wide from the edge closest to the pin to the edge farthest from the pin. The edges 14 and 15 of the side portions 10 and 11 preferably are angled such that the edges of the two adjacent vents are about 0.0079 inch apart at the point closest to the pin and about 0.0114 inch apart at the point farthest from the pin. Therefore, the spoke is about 0.0079 inch wide at a point closest to the pin and about 0.0114 inch wide at a point farthest from the pin. Preferably, the vents are arranged so that they are at a minimum of approximately 0.010 inch from the edge of the plated through hole. An increase in the slope of the angle between the vents, and, hence, an increase in the width of the spoke as the distance away from the pin increases, reduces inductance caused by the long narrow channel. This increasing spoke width with increasing distance from the through hole provides the maximum thermal area with only one neck down restricting capacitance.

Due to the fact that the spoke design shown in FIG. 5 is made of individual line segments, it can be line drawn in automatic mode of generation thereby reducing costs, time, and expense. On the other hand, the standard thermal break design must be flashed through and includes use of a polygon and can not be automated.

Figure 8:
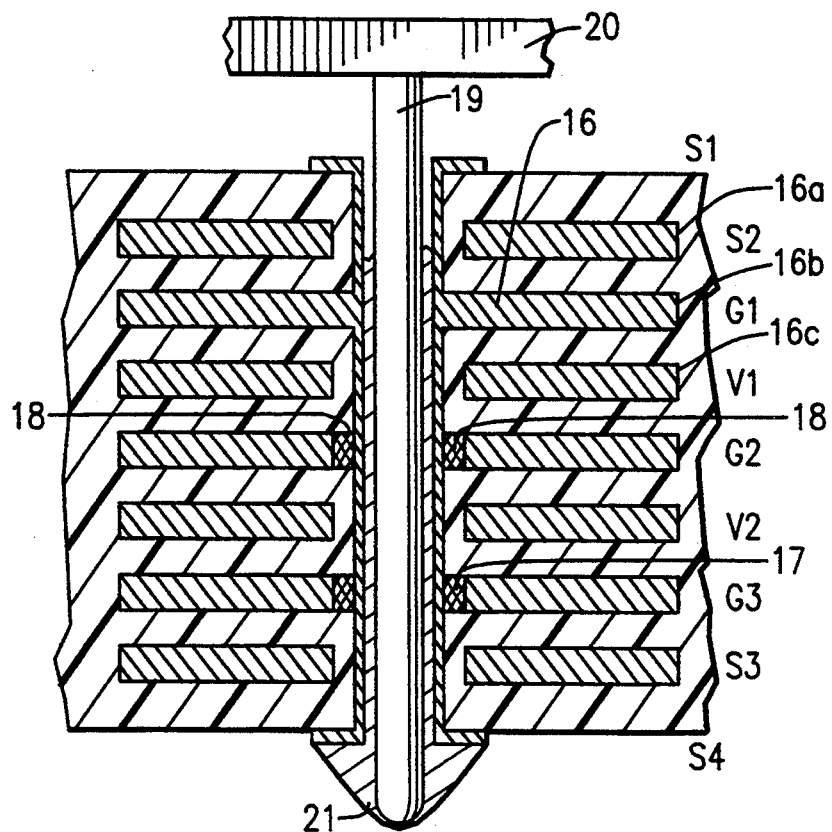
FIG. 8 represents an overhead cross-sectional view of an another design for thermal vents according to another embodiment of the present invention.

The vent design shown in FIG. 5 can be seen in cross section in FIG. 8. The vent design shown in FIGS. 5-7 is preferably used in an enhanced thermal break design shown in FIG. 8 in which some of the power planes are provided with vents and some include a solid connection completely about the plated through hole. To achieve optimum AC and DC power distribution, it is desirable to tie common multiple ground planes together at each ground pin location as well as at each voltage pin location. In the embodiment shown in FIG. 8, to ensure that more than 50% of the plated through hole is filled with solder during rework, the connection to the plane should be solid as indicated by the solid connection 16 with the power plane extending all the way to the plating on the plated through hole. To ensure that more than 50% of the plated through hole is filled with solder during rework, the circuit board or card may also include an improved thermal brake design, including the vents shown in cross section in FIG. 5. With this design, series inductance and resistance from the component 20 to the closest ground plane G1 in FIG. 8 is unchanged by the thermal breaks at the remaining ground planes G2 and G3. Table 1 presents differences in various electrical parameters comparing a plated through hole about which either four spokes as seen in FIG. 5 or two spokes are included in the thermal mass design.

TABLE 1

| Improved Thermal Break Design-Electrical Parameters | | |
|---|---|---|
|  | Four Spokes | Two Spokes |
| Self-Inductance (nH) | 0.018 | 0.035 |
| Resistance (mohm) | 0.2 | 0.3 |
| Maximum Current | depends upon application | depends upon application |

As seen in FIG. 8, a circuit board or card may include thermal vents 18, signal planes 16a, ground planes 16b, and voltage planes 16c. The card in the embodiment shown in FIG. 8 is approximately 0.055 inch thick and includes an approximately 0.040 inch plated through hole. The pin 19 is inserted into the hole and typically extends above the surface of the card about 0.06 inch and is about 0.028 inch in diameter. The example seen in FIG. 8 includes the desired greater than about 50% solder fill 21.

As seen above in Table 1, the design of the thermal break can effect the functional parameters of the card. To determine the significance of the thermal break inductance on functionality and performance, other power distribution inductance that is occurring in series with the thermal breaks must be considered. As an example, Table 2 shows the increase in series inductance due to the addition of a thermal break when added in series with a typical component/connector pin.

TABLE 2

Module/Connector Pin Comparison-
With/Without Thermal Break

|  | Con Pin | Con Pin + Break | Con Pin | Con Pin + Break |
| --- | --- | --- | --- | --- |
| Self-Inductance (nH) | 10.59 | 10.63 | 10.59 | 10.63 |
| Loop-Inductance (nH) | 13.06 | 13.13 | 13.06 | 13.13 |

The data in Table 2 reflects the worse case performance scenario in which two spokes of the thermal break are missing and/or open. In this situation, the self inductance increase due to the thermal break is less than about 6% in the lower planes. If, inductances of modular/chip power busses and card L/square were considered, the percentage increase in inductance due to the thermal break would be much lower. To ensure that the inductance to the power system is minimized, power vias can be added in the vicinity of thermal breaks to provide low inductance common points for ground or voltage. A power via is a plated through hole which is not associated with any component pins and which has solid connections at all ground (power) planes.

The values in Table 2 were determined using a module with a pin approximately 0.028 inch in diameter in an approximately 0.040 inch plated through hole with a typical card stand off of approximately 0.060 inch and an overall card thickness of approximately 0.060 inch. The connector pin numbers were determined using an approximately 0.020 inch diameter pin with an approximately 0.053 pin length. The loop inductance values assume one return circuit pin about 0.100 inch away, with the loop consisting of pin 1—thermal break 1—solid copper plane thermal break 2—pin 2. The thermal break values assume that two spokes are missing.

If the geometry of the circuit board or card does not allow for thermal breaks or the other vent configurations described above, single power pickups may be necessary to guarantee assembly/rework. This is especially true with cards using increased amounts of copper, therefore creating a greater thermal mass than was previously known and also due to the utilization of double and triple ties on the power and ground planes. To overcome these problems, the present invention also provides a "thermal tied power net" as described below.

Figure 9:
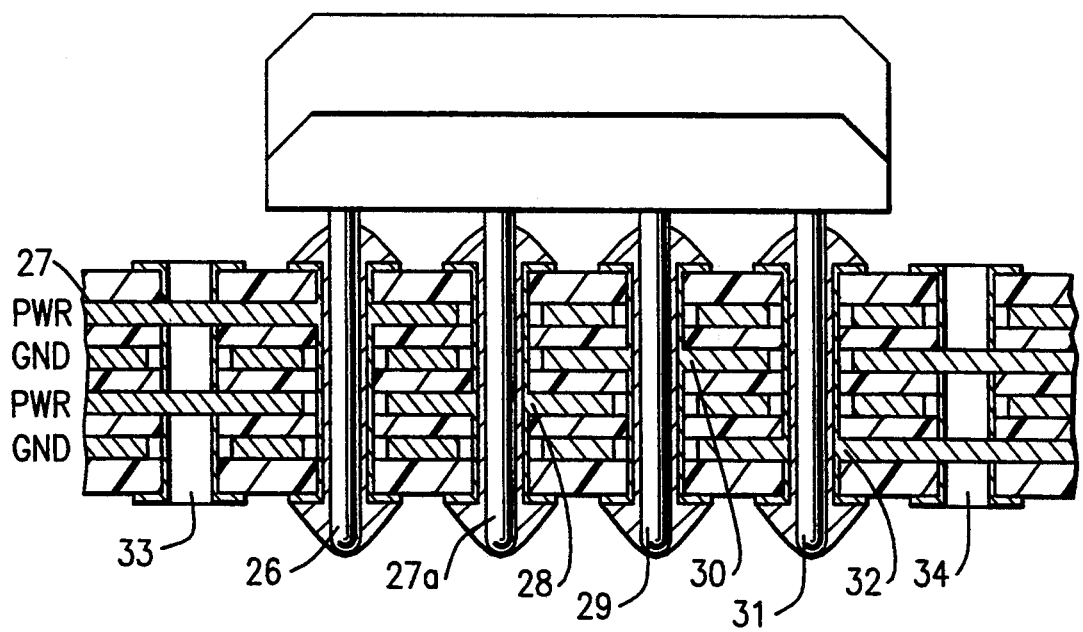
FIG. 9 represents a cross-sectional view of a printed circuit board or card including non-functional tie vias connected to the power planes of a circuit board or card according to one embodiment of the present invention.

As seen in cross section in FIG. 9, the plated through holes and, hence, pins extending from the components into the plated through holes are connected only to certain of the power planes. The space between the planes and the through hole may be a standard power clearance hole, depending upon the technology involved in the application of the circuit board or card. If a through hole is only connected to one plane, the heat generated during rework cannot flow to the other planes. The power planes are tied together with a power via. The thermal net eliminates the need to achieve reflow of the plating material in the through hole. The thermal mass occurs at the tie via's, away from the component.

In the embodiment shown in FIG. 9, the pins inserted into the plated through holes are tied to alternate planes. The first pin 26 is tied to the first power plane 27 the second pin 27 is tied to the second power plane 28 and the third pin 29 is tied to the first ground plane 30 while the fourth pin 31 is tied to the second ground plane 32. The first power via 33 is used to tie the first power plane 27 and the second power plane 28. The second power via 34 is used to connect the ground planes 30 and 32. The power vias 33 and 34 should be located in the card as close to the component as possible to provide common in between the power and ground planes.

Figure 10:
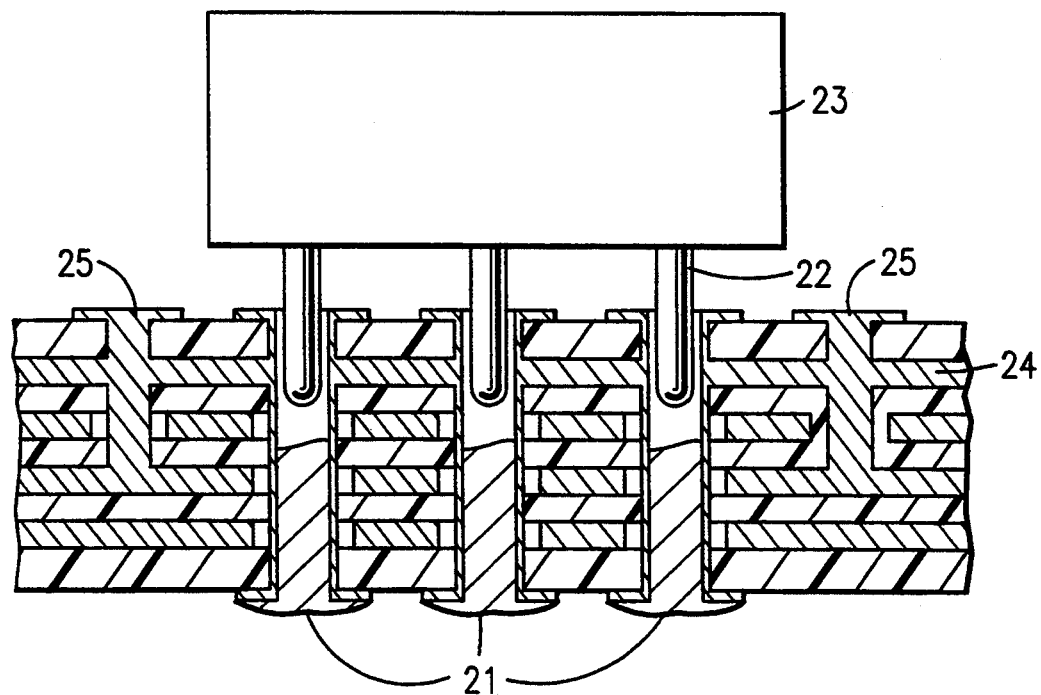
FIG. 10 represents a cross-sectional view of a printed circuit board or card including non-functional tie vias connected to the power planes of a circuit board or card according to another embodiment of the present invention.

Using the alternative embodiment of the thermal net design as seen in FIG. 10, the pins 22 of the component 23 are tied to a single plane 24. Non-functional tie vias 25 are used to tie either common power planes or common ground planes together. The embodiment shown in FIG. 10 includes double tie vias connected to two power planes. The power vias used to tie the ground planes are non-functional and in the embodiment shown in FIG. 10 are approximately 0,016 inch or greater, depending on the thermal function required. The non-functional power vias may be set in a net, interstitial of off grid.

The tie vias in FIGS. 9 and 10 may be used to tie either the power or ground planes. An advantage of these tie vias is that the thermal mass is concentrated at the tie vias rather than in the plated through hole, thereby concentrating the thermal mass away from the plated through hole. By removing the direct tie from near the plated through hole, use of the tie vias removes solder fill and rework problems associated with direct tie occurring at the plated through hole. The use of a net of vias ensures a short distance to the ties. Further, the tie vias require no hole fill or rework thereby eliminating the problems associated with concentrating heat at the plated through hole to melt solder to create hole fill 21. Since the via is not functional to the component, this is what is meant by non-functional, it removes the tie from rework unlike other embodiments in which the functional pins from the component are inserted throughout the plated through hole requiring solder flow to occur along the entire length of the plated through hole.

From a power distribution perspective, it is preferable that ground or power plane pickups alternate pin by pin rather than assigning all ground or power pins of a component to one plane. The advantages provided by alternating pickups among planes include the fact that alternate pickups take advantage of all plane-to-plane capacitances between ground or power plane pickups to reduce Delta-I noise. Delta-I noise is the inductive noise in a power distribution system created as a large number of drivers on a chip are turned on and is defined as (the change in current per unit of time)×(power inductance). Also, an equal current distribution among like planes is encouraged. Additionally, alternating pickups among planes provides a redundancy of plane commoning at many component sites (module/chip power buses) in addition to at the power vias. Further, alternating pickups result in the lowest inductance power distribution system due to advantage of mutual inductances of interleaved planes. Still further, alternating pickups establishes a better AC reference for off-module signal communication. Component-by-component assignment would more likely result in module-module AC reference differences due to Delta-I induced voltage transients. The addition of power vias in close proximity to single power pickups will partially compensate for the increased power distribution impedance seen by the component. It is recommended that one power via be added as close as possible to each single power tie to common like planes.

As seen in FIG. 9, by alternating the power and ground plane pickups to alternate pins-by-pin connections, rather than assigning all ground or power pins of a component to one plane, all plane to plane capacitances between power and ground planes are taken advantage of to reduce Delta-I noise. Also, such a pin to plane connection arrangement promotes equal current distribution among like planes. Further, a redundancy of plane communing occurs at many component sites such as module/chip power buses. Additionally, such alternating pin connections result in the lowest inductance power distribution due to the advantage of mutual inductances of interleaved planes. A better AC reference for off-module signal communication is also established by alternating pin placement. On the other hand, a component by component assignment would more likely result in module-module AC reference differences due to Delta-I induced voltage transients. In such an arrangement, the addition of power vias in close proximity to single power pickup will partially compensate for the increased power distribution impedance seen by the component. It is also recommended that one power via be added as close as possible to each single power tie to common like planes.

To further control the dissipation of heat through a circuit board or card, as seen in FIG. 11, thermal vents and/or heat trap vias may be located about the periphery of large modules such as TCM, SBC and card edge power components, and others having ground and/or power pins in remote corners. The heat traps and thermal vents localize the heat within the module site to minimize reflow of adjacent components. Not only do the thermal vents and heat trap vias prevent the flow of heat to adjacent components, they trap the heat next to the module thereby allowing corner power pins to heat up to reflow more evenly with signal pins located away from the periphery of the component thereby allowing a reduction of the number of heat cycles and reducing card stress. Further, confined heat made possible by the heat traps and thermal vents reduces heat dispersion to adjacent components reducing reflow to adjacent sites.

As seen in FIGS. 11–13, the module 35 includes inboard ground pins 36. Signal or voltage pins 37 include clearance lands 38. As in the embodiment shown in FIG. 11, the signal and voltage pins with the clearance lands act as thermal vents for the in board ground connections. However, due to their location about the periphery, ground pins at the corners 39 are not adjacent on all sides to such signal or voltage pins with clearance lands. Therefore, to reduce heat flow to adjacent components, thermal vents or heat trap vias 40 are added to the card about the edge of the component or module. As seen in FIG. 12, these thermal or heat trap vias may be added about all corners of the module. The inductance seen by the corner ground pins with thermal vents or heat trap vias is equal to or less than inboard ground pins surrounded by signal or voltage pins with clearance lands. Since the clearance holes created by the thermal vents or heat trap vias are comparable in diameter and on the grid lines as those holes existing in the interior of the module, the power distribution perimeters (L/square, R/square) seen by the corner pin will be the same as the existing module area.

FIG. 13 shows a close up cross section of a heat trap via 40 adjacent to a corner ground pin of the module. The squiggly lines represent the flow of heat created during rework as it flows from the areas interior to the module and is redirected by the thermal vents and/or heat trap vias back toward the plated through hole, where it will help to melt the solder or plating material. Therefore, the heat is prevented from dissipating into the rest of the card where it may damage the card and-/or attached components, helping to ensure that complete solder fill is more likely to occur. The attached component 35 has attached pins 35a inserted into the plated through hole.

Figure 14:
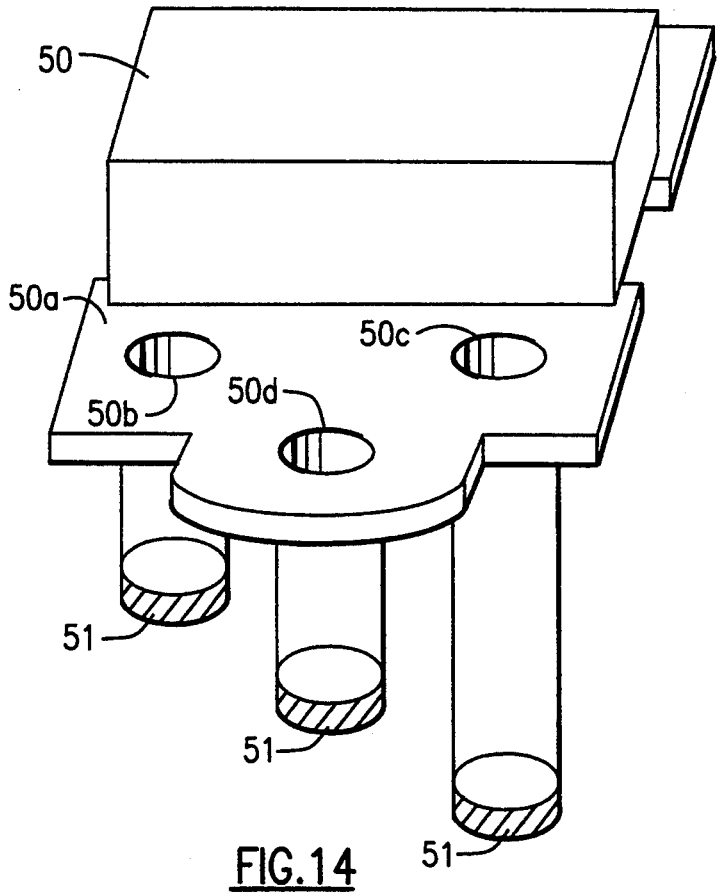
FIG. 14 represents a perspective view of a component to be attached to a circuit board or card to be attached to a circuit board or card according to one embodiment of the present invention shown in FIGS. 11, 12, and 13.

FIG. 14 shows a perspective view of a component to be attached to a circuit board or card including at least some of the improved thermal mass designs of the present invention. The component 50 includes alternating power pickups from a single pad thereby reducing inductance to the power or ground plane. The pad 50a in the embodiment shown in FIG. 14 is about 120×60 mils. The extent to which inductance is reduced depends upon the application involved.

Such a module as shown in FIG. 14 may be used with a circuit card or board including 0.012 mil via's on a 25 mil grid. According to the invention, a 25 mil grid may be offset from the straight grid single tie by about 50 mil. Also, a 25 mil grid may be interstitial to allow alternate pick-up. This arrangement is demonstrated in the embodiment shown in FIG. 14, where the pick-ups 50b and 50c are about 50 mils apart. The pick-up 50d is about centered between the two pickups 50b and 50c and its center is about 25 mils away from a line passing through the center of the pick-ups 50b and 50c.

Figure 14A:
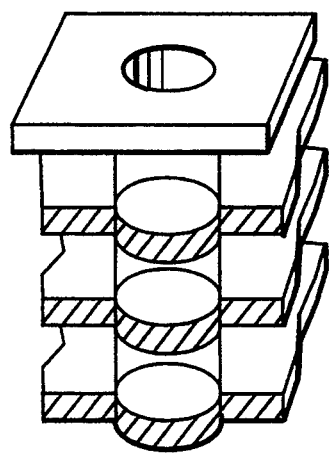

In the prior art, depicted in FIG. 14a, it was common to tie all three planes with a single triple tie. However, this method results in thermal mass problems. Therefore, the embodiment shown in FIG. 14 in which each plane is connected to a separate tie was developed. The module may be used with any of the various embodiments of the present invention described in detail above.

As seen in FIGS. 15a–e, some examples of various configurations of a multi-layer circuit board or card present different problems requiring different solutions for managing thermal conditions within the circuit board or card according to various embodiments of the present invention. The examples shown in FIGS. 15a–e are illustrative and do not include all possible plane and thermal mass designs according to the present invention. The design used to accomplish thermal management depends upon the specifics of the circuit board or card cross section, component type to be reworked, and the number of voltage or ground planes that it is desired to common at each power pin. The options include, for example, thermal vents, heat trap vias, solid connections to the top power or ground plane with improved thermal break design at all remaining plane connections with supplemental power vias recommended to common like planes, and single power pickups with alternating plane assignments with supplemental power vias to common like planes.

Figure 15A:
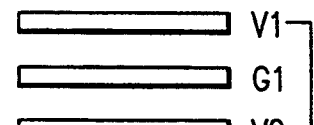
FIGS. 15a–e represent various configurations of circuit boards with which various embodiments of the present invention may be used.
Figure 15B:
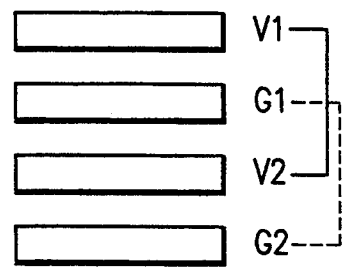

The embodiment shown in FIG. 15a includes finished circuit board or card thickness of between about 0.040" and about 0.062", with layers V1, V2, G1, and G2 all including 0.5 ounce material. The ounce measurement for the material defines the amount of material that is present per approximately one square foot of about 0.0014" thick of that material. For the embodiment shown in FIG. 15a, thermal vents at the power pickups could be used if the carrier thickness exceeds about 0.062". The embodiment shown in FIG. 15c, the planes V1, G1, V2, and G2 include 1.0 ounce material and a thickness of between about 0.040" and about 0.062"

Figure 15C:
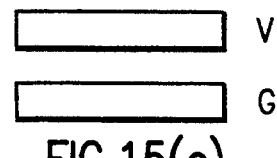

In the embodiment shown in FIG. 15c, one ground plane and one voltage plane are provided which are made of 2.0 ounce material. The card has a thickness of between about 0.040" and about 0.062. In this case, vents may be provided at power/ground pickups.

Figure 15D:
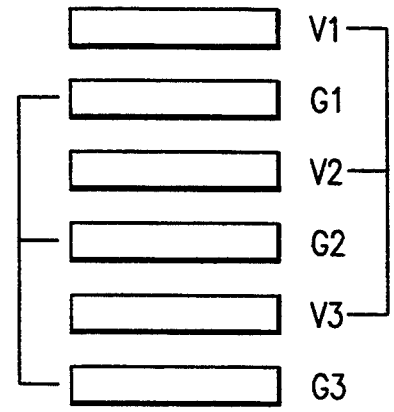

The embodiment shown in FIG. 15d includes three ground planes, G1, G2, and G3, and three voltage planes, V1, V2, and V3. The planes may be 0.5 oz., 1.0 oz., or 2.0 oz. or any mix thereof, utilizing multiple ties. The circuit board may be between about 0.062" and about 0.090" in thickness and above. In such an embodiment, thermal breaks may be provided on all ties, except for solid connections at the top voltage and ground planes. These thermal breaks are combined with a power net for even power distribution. FIG. 15d shows that as layered cross-section thickness increases, the same symmetry should be maintained with solid connection on the uppermost layers.

Figure 15E:
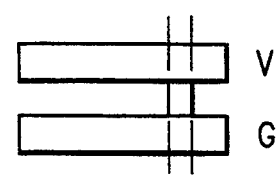

In FIG. 15e, thermal net with power vias may be used. The embodiment includes a voltage plane and a ground plane and off grid/interstitial <100 mils on connectors/high density modules. If a grid is interstitial, it is physically impossible to vent or break based upon a of geometric space. In such a situation, as illustrated in FIG. 16, if vents were placed about the through holes, they would overlap. In FIG. 16, the dotted lines about the through holes represent where vents or breaks would extend to if they were included. Such a card could not physically exist since so much material would be lacking from the circuit board or card. Therefore, single ties and ties into a remote via outside the grid array must be used, as shown about the periphery of the grid in FIG. 16.

By employing the present invention for thermal design into the structure of circuit boards and cards, a significant savings is realized as compared to using prior art techniques for designing and constructing circuit boards and cards. The present invention allows a great decrease in the number of circuit boards and cards which are lost during rework and the number which are lost to scrap. Savings are also achieved in time, energy and materials since fewer boards or cards need to be reworked due to proper connections not being formed due to adequate solder temperature not being achieved.

Regarding the prior art, the present invention also provides the unexpected result of reducing inductance while also allowing thermal abatement. This is at least in part due to the design of the present invention, especially as seen in FIG. 5, with spokes that vary in width, increasing in width as the distance from the pin in-creases. The present invention is especially useful with high performance packages that are highly sensitive to noise. In prior art thermal designs which The present invention may also be used for laminates of higher performance and higher density with maximum card thickness with multiple common ties of up to seven ounces of copper used in a process. Some active components can not be used in an immersion process, since they have a solder hierarchy that would reflow when chips are attached in an immersion state. Therefore, the present invention is also designed in the Z-axis as to a common reference to a top plane.

We claim:

1. A multi-layer printed circuit board or card including a plurality of conductive planes, including ground and power planes, and insulating planes, said circuit board or card having a plurality of through holes formed through at least one of said planes, said through holes having an electrically conductive material plated onto the inside surface, at least one integrated chip or component being attached to said circuit board or card such that pins made of an electrically conductive material and attached to a surface of said chip or component extend into said plated through holes, said circuit board or card comprising:

at least one thermal relief passage in at least one of said planes for preventing the diffusion of heat throughout said circuit board or card during the securing or removal of said pins in said plated through holes by the heating of said plating material to a temperature above a melting point of the plating material, said at least one thermal relief passage located in the vicinity of at least one of said plated through holes and being free from connection with said pins.

2. The multi-layer printed circuit board or card according to claim 1, wherein said at least one thermal relief passage is a thermal vent formed in at least one of said conductive planes, said thermal vent being a hollow opening in said at least one conductive plane and being formed in the vicinity of at least one of said plated through holes.

3. The multi-layer printed circuit board or card according to claim 1, further comprising a plurality of said thermal relief passages symmetrically located in the vicinity of and about at least one of said plated through holes.

4. The multi-layer printed circuit board or card according to claim 3, wherein said thermal relief passages are thermal vents.

5. The multi-layer, printed circuit board or card according to claim 4, wherein a space between adjacent thermal vents is in the form of a spoke, said spoke increasing in width as the distance from the plated through holes increases.

6. The multi-layer printed circuit board or card according to claim 3, wherein four circular thermal vents are located in the vicinity of each of said plated through holes.

7. The multi-layer printed circuit board or card according to claim 6, wherein the center of each of said thermal vents is located about 0.050 inch away from a straight line passing through the center of said plated through hole and the center of adjacent thermal vents is about 0.100 inch from the center of the adjacent thermal vents.

8. The multi-layer printed circuit board or card according to claim 4, wherein each conductive plane in said multi-plane circuit board or card includes said thermal vents adjacent said plated through holes.

9. The multi-layer printed circuit board or card according to claim 4, wherein said thermal vents extend entirely through each of said conductive planes.

10. A multi-layer printed circuit board or card according to claim 2, wherein a space between opposite ends of said at least one thermal vent is in the form of a spoke, said spoke increasing in width with increasing distance away from the at least one plated through hole.

11. The multi-layer printed circuit board or card according to claim 10, wherein said at least one vent is eight sided, with a first side parallel to a straight line passing through the center of said plated through hole; a second side parallel to said first side, said first side being closer to said plated through hole; third and forth sides connected to opposite ends of said first side, said third and fourth sides extending from opposite ends of said first side at an acute angle toward said through hole; fourth and fifth sides extending from opposite ends of said second side parallel and being to said third and fourth sides; seventh and eighth sides connecting said third and fourth sides with said fifth and sixth sides and being angled toward the center of said vent with increasing distance from said through hole.

12. The multi-layer printed circuit board or card according to claim 10, wherein said at least one thermal vent extends substantially around one of said plated through holes, said spoke including a plurality of substantially straight segments and wherein said spoke is defined by the ends of the one spoke.

13. The multi-layer printed circuit board or card according to claim 2, wherein said circuit board includes thermal vents selectively formed in ground planes in said multi-layer circuit board or card, such that a first ground plane closest to said attached chip or component on said circuit board or card does not include thermal vents in the vicinity of said plated through holes and ground planes further from said attached chip or component include said thermal vents in the vicinity of said plated through holes.

14. The multi-layer printed circuit board or card according to claim 1, wherein:
said attached component or chip is a module, said module including a plurality of components attached thereto;
said conductive planes are selectively functionally connected to said plated through holes; and
said at least one thermal relief passage is formed about the perimeter of the module and extends through the entire length of said circuit board or card, and is plated on an inside surface with an electrically conductive material, and is connected either to all of said ground planes or said power planes.

15. The multi-layer printed circuit board or card according to claim 1, wherein said at least one thermal relief passage is formed about the perimeter of the chip or component, and extends through the entire length of said circuit board or card.

16. The multi-layer printed circuit board or card according to claim 15, wherein said circuit board or card also includes thermal vents formed about the plated through holes formed where the pins extend from the chip or component into the plated through holes.

17. The multi-layer printed circuit board or card according to claim 15, wherein the pins attached to said chip or component are of various lengths and are selectively attached to said power plane and ground planes.

18. The multi-layer printed circuit board or card according to claim 1, wherein said board or card includes a plurality of said passages, said passages being thermal vents and surrounding at least one of said plated through holes, said through hole and said thermal vents being co-linear.

19. The multi-layer printed circuit board or card according to claim 1, wherein said board or card includes alternating rows of said plated through holes and plural thermal relief passage formed in at least one of said conductive planes, said rows of through holes being between said rows of thermal relief passages and said rows of thermal relief passages being between said rows of through holes.

* * * * *